United States Patent [19]  [11] 4,305,974
Abe et al.  [45] Dec. 15, 1981

[54] METHOD OF MANUFACTURING A SEMICONDUCTOR DEVICE

[75] Inventors: Ryoji Abe, Fuchu; Makoto Serigano, Aizuwakamatsu; Shuji Tabuchi, Kawasaki, all of Japan

[73] Assignee: Fujitsu Limited, Kawasaki, Japan

[21] Appl. No.: 176,231

[22] Filed: Aug. 8, 1980

Related U.S. Application Data

[63] Continuation of Ser. No. 927,949, Jul. 25, 1978, abandoned.

[30] Foreign Application Priority Data

Jul. 27, 1977 [JP] Japan ................................. 52-90151

[51] Int. Cl.³ .................... H01L 21/283; H01L 21/88
[52] U.S. Cl. ................................. 427/89; 156/643; 156/655; 156/657; 204/192 E; 427/90; 427/93; 427/95; 427/96; 430/314
[58] Field of Search ....................... 156/643, 655, 657; 204/192 E; 427/89, 90, 93, 95, 96; 430/314

[56] References Cited

U.S. PATENT DOCUMENTS 3,663,277  5/1972  Koepp et al. ....................... 427/240
4,025,411  5/1977  Hom-Ma ............................. 156/643
4,123,565  10/1978  Sumitomo et al. ................. 427/89

FOREIGN PATENT DOCUMENTS 48-865422  7/1973  Japan .
48-79987  10/1973  Japan .
48-83788  11/1973  Japan .

Primary Examiner—John D. Smith
Attorney, Agent, or Firm—Staas & Halsey

[57] ABSTRACT

A semiconductor device with multilayer wirings can be produced with high yield by applying a liquid source for silicate film to a surface of a chemically vapor deposited insulating layer placed on a surface of the semiconductor substrate in order to provide a smoothed surface. After solidification of the liquid source, the substrate is subjected to a controlled etching to leave the same contour as the one of the smoothed surface on the resultant surface. An upper wiring layer is placed on the resultant smoothed surface in contact with a lower wiring layer through the insulating layer thereby decreasing disconnections in the upper wiring layer which could easily be caused by steep edges existing on an insulating surface layer of a conventional device.

5 Claims, 9 Drawing Figures

METHOD OF MANUFACTURING A SEMICONDUCTOR DEVICE

This is a continuation of application Ser. No. 927,949 filed July 25, 1978, now abandoned.

BACKGROUND OF THE INVENTION

1. Field of the Invention

This invention relates to a method for manufacturing a semiconductor device, and more particularly, to a method of forming multilayer wirings on a semiconductor substrate with high yield.

2. Description of the Prior Art

Semiconductor integrated circuits have been used for saving space and cost in a variety of electronic systems and devices. It is always desirable to further reduce total chip size with any given circuit function. For this purpose, circuit elements in the integrated circuit are first minimized in physical size on a semiconductor substrate. But circuit wirings are still required on the limited surface area over the semiconductor substrate. Multilayer wirings on the limited surface area allow the circuit wirings to cross freely.

In a process of making the multilayer wirings, great attention has been paid to avoiding circuit discontinuities due to surface roughness. One of the inventors has previously proposed the introduction of a spin-on-glass technique for the formation of an insulating layer between wirings, in Japanese Pat. No. 865422. According to the proposed process, the spin-on-glass layer is formed on the entire surface of the semiconductor substrate having a first wiring layer. The source material of the spin-on-glass layer may be a type of silanol solution. This solution may be applied to the substrate surface by means of the same spinner which is used for spin-coating the photoresist. The substrate is then subjected to a heating process for solidifying the coating. In FIG. 1, there is shown a cross section of the substrate covered with the spin-on-glass layer. The substrate 10 is first covered with the surface insulating layer 11 and the first wiring layer 12. The spin-on-glass layer 13 accumulates in the step portion of each side of the layer 12 which causes the surface roughness. The glass layer 13 effectively covers the steps to provide a smoothed top surface. The insulating layer 14 is deposited on the smoothed top surface by means of the well known chemical vapor deposition apparatus. It was expected that the smoothed top surface would successively provide a smooth surface on the insulating layer 14. But it was found that the insulating layer 14 still had the stepped surface at each side of the layer 12 due to the deposition characteristics of the layer 14, although the degree of the step was somewhat reduced. The second wiring layer 15 is placed on the stepped surface of the insulating layer 14. In practice, aluminum is vapor deposited on the surface of a plurality of semiconductor substrates for mass production. As shown in FIG. 1, the second wiring layer 15 is substantially reduced in thickness at the stepped portion on the semiconductor substrate toward which the aluminum vapor was not directed uniformly. In the worst case, the second wiring layer 15 is electrically isolated at the stepped portion whereby the production yield has been limited to around fifty percent.

Another technique is seen in Japanese Pat. Nos. 48-79987 and 48-83788 which were laid open on the dates of Oct. 26, 1973 and Nov. 8, 1973, respectively. Both publications disclose a process for manufacturing the multilayer wirings in which the insulating layer 14 is firstly deposited in contact with the first wiring layer 12 and the spin-on-glass layer is then coated on the insulating layer 14 with a smoothed surface. The upper wiring is formed on the smoothed surface of the insulating layer 14. According to the disclosure, the process is not affected by the deposition characteristics of the insulating layer 14, whereby a more reliable mass production can be expected. However, we have realized that an over-etching of the spin-on-glass layer could easily occur in opening the windows in the underlying insulating layer 14, thereby forming the stepped portion again. The typical manner of such damage is shown in FIG. 2 in which the same reference number is used for identifying the same materials.

SUMMARY OF THE INVENTION

An object of the present invention is to provide an improved process for manufacturing semiconductor devices.

Another object of the present invention is to provide a process for making multilayer wirings with high reliability.

A further object of the present invention is to provide an improved process for making multilayer wirings capable of forming an upper layer of wiring without having wiring discontinuities.

Still a further object of the present invention is to provide an improved process for making multilayer wirings in which an etching process for an electrode window does not cause a stepped portion.

In general, various types of integrated circuits are provided with multilayer wirings on a surface of a semiconductor substrate without having wiring discontinuities in accordance with the present invention. The semiconductor substrate is originally covered with an insulating surface protective film on which a first wiring layer is extended in contact with respective semiconductor elements formed in the semiconductor substrate.

A first insulating layer is formed on the surface protective film including the surface of the first wiring layer by a known process, such as vacuum deposition or chemical vapour deposition. The deposited first insulating layer may have a surface roughness due to protrusion of the first wiring layer or due to characteristics of the deposition process. In a preferred embodiment of the present invention, the first insulating layer is provided with a greater thickness than a predetermined thickness of an insulator for isolating different wiring levels.

A silicate film is then formed on the surface of the first insulating layer to provide a smoothed surface. The silicate film covers any steps, edges, or depressions due to the characteristics of any prior deposition process thereby providing the smoothed surface. For this purpose, an organic compound solution, such a silanol solution, is dropped on the surface of the first insulating layer while the substrate is rotated at high speed. During the spin-coating of the silanol solution, it covers any steps to provide the smoothed surface. The silanol is then converted into a solid silicate film with the smoothed surface.

A characteristic feature of the present invention is then carried out, to etch off the surface layer of the silicate film until the first insulating layer is reduced in thickness to a predetermined thickness and the silicate film is completely removed over the first wiring layer. The etching process is carried out by using a wet chemical etching and/or dry etching. The surface layer of silicate film is thus removed over the entire surface of the substrate whereby the finished surface of the substrate is provided with the same contour as the silicate film.

In the following steps, apertures are placed in the first insulating layer in accordance with a known process without causing steep edges.

A second wiring layer is placed on the well smoothed surface of the substrate in contact with the first wiring layer through the apertures. The second wiring layer can be formed by using a standard vacuum deposition system wherein a lot of the substrates are placed for mass production. A high production yield results from using substrates with such smoothed surfaces.

BRIEF DESCRIPTION OF DRAWINGS

FIG. 3 shows a cross section of a typical bipolar integrated circuit with a first wiring layer, FIG. 4 shows a cross section of the integrated circuit covered with a silicate film, FIG. 5 shows a cross section of the integrated circuit having a phosphosilicate glass layer on the silicate film, FIG. 6 shows a cross section of the integrated circuit covered with a second silicate film, FIG. 7 shows a cross section of the integrated circuit having a smoothed etched surface, FIG. 8 shows a cross section of the integrated circuit covered with a photoresist layer, and FIG. 9 shows a cross section of the integrated circuit having a second wiring layer.

DESCRIPTION OF THE PREFERRED EMBODIMENTS

Figure 3:
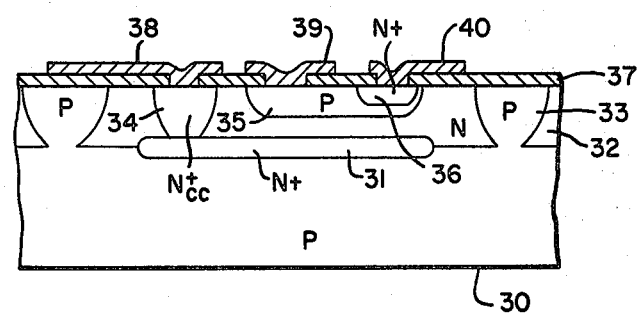
FIGS. 3 to 9 show cross sections at each step of a series process for manufacturing an integrated circuit with a multilayer wirings in accordance with the present invention.

A preferred embodiment of the present invention is now described with reference to FIGS. 3 to 9. There is shown in FIG. 3 a cross section of a typical bipolar integrated circuit with a first wiring layer. In FIG. 3, a P-conductivity type silicon semiconductor substrate 30 is prepared for a starting material. A buried layer 31 of N+ conductivity type is formed under the surface area of the substrate 30. An N-type conductivity silicon epitaxial layer 32 is formed and an isolation diffusion region 33 is formed in the epitaxial layer 32. An Ncc+ collector contact diffusion layer 34 is provided in contact with the buried layer 31. A P-conductivity type base area 35 and a N-conductivity type emitter area 36 are formed by a standard diffusion process. A surface of the epitaxial layer 32 is covered with an insulating surface protective film 37 except for respective window areas through which collector electrode 38, base electrode 39 and emitter electrode 40 are accessed and extended on the protective film 37. The electrode material is typically aluminum with thickness of 0.8 to 1.2 microns. The aforesaid structure of the integrated circuit is well known in the art and is not explained here in detail.

Figure 4:
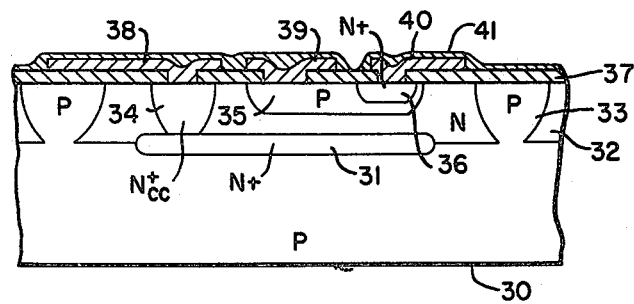

With reference to FIG. 4, the substrate 30 is placed in a spinner which may also be used for spin-coating the photoresist. Silanol solution is dropped onto the substrate surface while it is rotated at approximately 5000 rpm. The silanol solution is mainly comprised of an organic solvent, such as ethanol and alcohol, added with silanol which has chemical formula of Si(OH)$_4$. Such a silanol solution has many sources in the market, one of which is silica film (the trade name) sold by Emulsitone Co. New Jersey, U.S.A.

After the spin-coating of the silanol, the substrate is heated at 170° C. for 10 to 30 minutes in a nitrogen atmosphere. During the heating, the silanol in converted into an inorganic solid silicate film in accordance with the following equation.

$$Si(OH)_4 \rightarrow SiO_2 + 2H_2O \uparrow$$

The resultant structure is illustrated in FIG. 4. The silicate film 41 covers the top surface of the electrodes 38, 39 and 40 in thickness of 1500 angstroms or less, preferably 400 to 1000 angstroms. The silicate film 41 also effectively covers the steep edges of the electrodes 38, 39 and 40 to provide a smoothed surface of the substrate. The main purpose of the silicate film 41 is to protect the surface of the electrodes against the so-called hillrock, which is upright abnormal crystal regrowth caused by any following heat process. The formation of the silicate film is not critical in the present invention but it is useful for avoiding electrical short circuit in the multilayer wirings.

Figure 5:
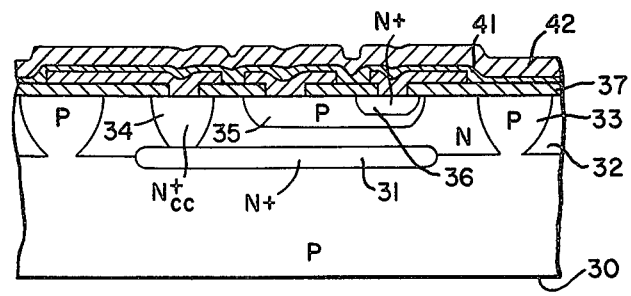

The next step is to cover the substrate surface with a phosphosilicate glass layer 42 as shown in FIG. 5. For this step, the substrate 30 is placed in a reactive furnace to which monosilane and phosphine are introduced as reactive gases with help of nitrogen carrier gas. The substrate is heated to around 450° C. to form the phosphosilicate glass layer of 1.2 to 1.5 microns. The glass layer 42 has to be such a relatively thick layer that it exceeds the required value for the insulating layer between wirings. The reason for this will be apparent later.

Figure 6:
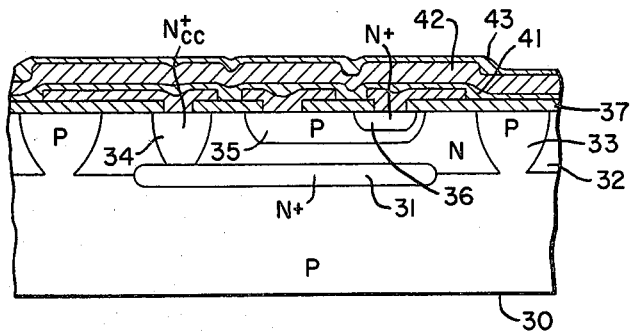

The substrate 30 is again set in the spinner and heated as described above to cover its surface with the second silicate film 43 as shown in FIG. 6. The thickness of the silicate film 43 is selected to be from 500 to 1500 angstroms thick, typically 800 to 1100 angstroms thick, on the flat surface of the glass layer 42. An annealing is carried out in a furnace at 400° to 500° C. for 10 to 30 minutes, typically at 450° to 480° C. for 15 minutes. During the annealing, densification of the glass layer 42 and solidification of the spin-coated silicate film are carried out simultaneously.

It can be seen in FIG. 6 that the second silicate film 43 covers the hollows or depressions thereby providing the smoothed or flat surface.

It is followed by an etching process which is the main characteristic feature of the present invention. It was found that chemical wet etching had enough reliability to remove a surface layer of the second silicate film 43 and the glass layer 42 in a substantially equal depth all over the entire surface. The etching solution can be a buffered solution of hydrogen fluoride which is comprised of 48% HF and 42% NH$_4$F. The buffered HF solution itself is well known in the art and each part of the HF and NH$_4$F is so selected that the etching rates of the second silicate silicate film and of the glass layer are preferably 1:1 to 3:1. Both the silicate film and the glass layer may have an etching rate of approximately 5000 to 6000 Å/min., for example.

Figure 1:
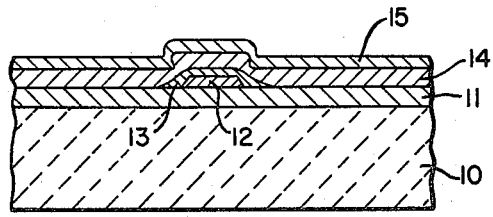
FIG. 1 shows a cross section of a conventional integrated circuit with multilayer wirings.
Figure 2:
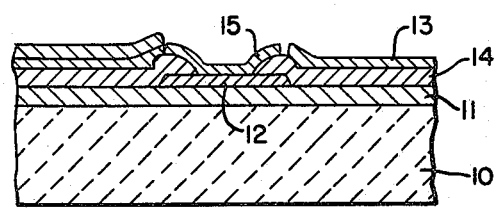
FIG. 2 shows a cross section of another conventional integrated circuit with multilayer wirings.
Figure 7:
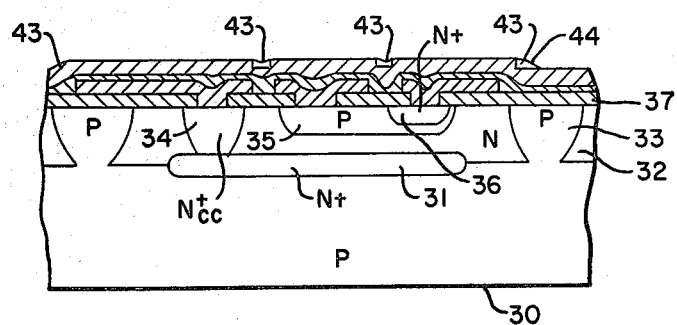

The wet etching is carried out for enough time to reduce the thickness of the glass layer 42 to the predetermined value, such as one micron. It is noted here that the etching depth is substantially uniform all over the surface whereby the original contour of the silicate film 43 is kept on the etched surface of the substrate. FIG. 7 shows the characteristic structure of the substrate having the smoothed etched surface 44. In this embodiment, the finished substrate is provided with the silicate film 43 on the surface, which would not affect the electrical insulation characteristic. It is apparent that the present invention is not limited to the instant structure. In a case that the etching depth is deeper, the silicate film 43 would not remain at the depressions of the glass layer 42. It is further noted that the silicate film 43 is completely removed over the electrodes 38, 39 and 40 to avoid the damage which was described with reference to FIG. 2.

Figure 8:
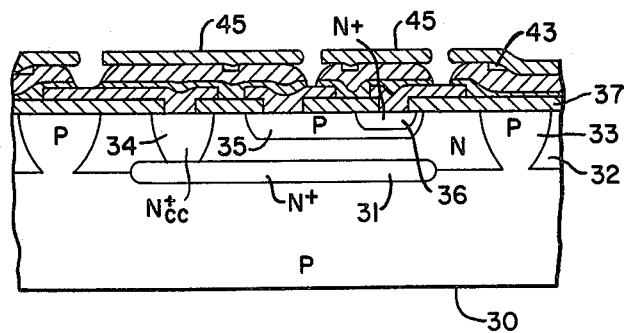

The substrate is then subjected to a photoetching process to remove the glass layer 42 at required positions. In this step, the photoresist layer 45 is applied on the surface and developed in accordance with a known process as shown in FIG. 8. A gas etching can be applied to etch off the surface layer of the glass layer. Secondly, the substrate is dipped into a 2% KOH solution for 5 to 10 seconds to weaken the adherence of the resist 45. Finally, the same etching is carried out to expose the electrode surface and to provide a well tapered surface of the glass layer at the electrode windows. After the etching the resist is removed from the substrate surface. Another taper etching is carried out by using ion implantation of phosphorous. This technique is discussed in the technical paper presented at the International Electron Device Meeting, 1977, entitled "Tapered windows in phosphorous-doped SiO$_2$ by ion implantation".

Figure 9:
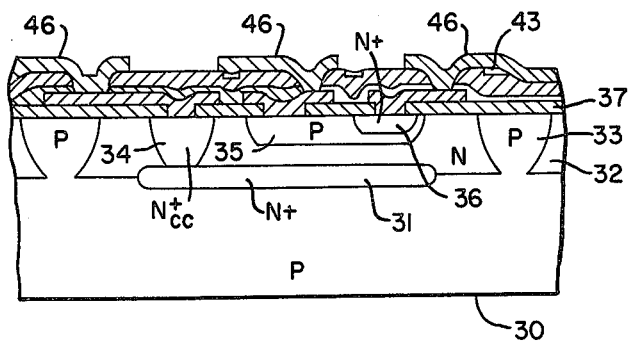

A final step of this embodiment is the formation of the second wiring layer 46 as shown in FIG. 9. The typical material for the second wiring layer 46 is aluminum which was also used for the electrodes 38, 39 and 40. The aluminum layer 46 may be formed by conventional vacuum deposition. It can be seen that the aluminum layer 46 is placed on the smoothed etched surface 44 whereby wiring discontinuities at the edges of the lower electrodes 38, 39 and 40 are effectively prevented. It was found that the production yield was kept over 95% throughout the process herein above described.

The present invention was described with regard to the aforesaid preferable specific embodiment. However, the present invention is not limited to this specific embodiment and various other processes would be obvious to a skilled worker in the art.

For example, the controlled wet etching explained with reference to FIG. 7 can be replaced by a dry etching such as gas plasma etching, ion etching sputtering, or reactive sputtering. According to the dry etching, there is no specific requirement for material to be used as the insulator between wirings. Therefore the phosphosilicate glass layer can be replaced by other dielectric materials, for example silicon nitride or borosilicate glass.

Furthermore, the single aluminum layer for the wirings can be replaced by a bi-metal structure such as polysilicon-aluminum (Si-Al), molybdenum-gold (Mo-Au) or titanium-silver (Ti-Ag), or three level structure such as Ti-Pt-Au, Ti-Pd-Au, Si-Ti-Al or Ti-W-Al.

In addition, it is apparent that the present invention can be equally applicable to MOS processes, including a silicon gate MOS process and also integrated circuits with a LOCOS (locally oxidized semiconductors) structure. Furthermore, the present invention may be applied to an integrated circuit with an insulating substrate, such as an SOS (Silicon on Sapphire). It is obvious that multilayer wirings with more than three wiring levels can be formed by repeating the process described above.

What is claimed is:

1. A method of manufacturing a semiconductor device comprising the steps of
    forming a first insulating layer on a surface of a semiconductor substrate,
    forming a first conductive wiring layer on said first insulating layer,
    forming a second insulating layer on said first conductive wiring layer and said first insulating layer, the surface of said second insulating layer having irregularities, the thickness of said second insulating layer being greater than is required of such an insulating layer for insulation between two wiring layers,
    applying a liquid film material to the entire surface of said second insulating layer for providing a smoothed top surface thereover, then converting said liquid film material into a third insulating layer with said smoothed top surface,
    subjecting said smoothed top surface to etching means for removing a surface layer over said surface to result in a final smoothed top surface for receiving a second wiring layer, said etched layer comprising an upper portion of said second insulating layer, said final smoothed surface comprising portions of said third insulating layer in said surface irregularities of said second insulating layer,
    selectively removing said second insulating layer to form windows to expose portions of said first conductive wiring layer, including removal of any portions of said third insulating layer in any of said irregularities within said windows, and
    forming a second conductive wiring layer over said smoothed top surface in selective contact through said windows with said exposed portions of said first conductive wiring layer.

2. A method of claim 1, said etching means comprising a chemical etching liquid bath.

3. The method of claim 1, said etching means selectively comprising means for plasma etching, sputtering etching and ion etching.

4. The method of claim 1, said liquid film material comprising a silanol solution.

5. The method of claim 1, said second insulating layer comprising a phosphosilicate glass layer and said etching means comprises a chemical etching liquid bath.

* * * * *

UNITED STATES PATENT AND TRADEMARK OFFICE
CERTIFICATE OF CORRECTION

PATENT NO. : 4,305,974
DATED : Dec. 15, 1981
INVENTOR(S) : Abe et al

It is certified that error appears in the above—identified patent and that said Letters Patent is hereby corrected as shown below:

Front page, [57] ABSTRACT, line 4, after "for" insert --a--;
    line 9, delete "the one";
    line 10, "surface." should be --surface of the substrate.--;
    line 11, after "smoothed surface" insert --of the substrate,--;
    line 12, after "insulating layer" insert --,--;
    line 13, "disconnections" should be --discontinuities--;
    line 14, after "by" insert --any--.

Column 2,  line 2, delete "the" (first occurrence);
    line 3, "firstly" should be --first--;
    line 7, "disclosure," should be --disclosures,--;
    line 10, "we have realized that an" should be --an--;
    line 45, "vapour" should be --vapor--.

Column 3,  line 26, "a multilayer" should be --multilayer--.

Column 4,  line 9, "silica film" should be --Silica Film--;
    line 13, "silanol in" should be --silanol is--;
    line 31, "circuit" should be --circuits--.

Column 5,  line 40, ""." should be --."--;
    line 51, "herein above" should be --hereinabove--.

UNITED STATES PATENT AND TRADEMARK OFFICE
CERTIFICATE OF CORRECTION

PATENT NO. : 4,305,974

DATED : Dec. 15, 1981

INVENTOR(S) : Abe et al.

It is certified that error appears in the above—identified patent and that said Letters Patent is hereby corrected as shown below:

Column 6, linr 63, "comprises" should be --comprising--.

Signed and Sealed this

Tenth Day of August 1982

[SEAL]

Attest:

GERALD J. MOSSINGHOFF

Attesting Officer

Commissioner of Patents and Trademarks